United States Patent [19]
Ohtani et al.

[11] Patent Number: 6,099,643
[45] Date of Patent: Aug. 8, 2000

[54] APPARATUS FOR PROCESSING A SUBSTRATE PROVIDING AN EFFICIENT ARRANGEMENT AND ATMOSPHERIC ISOLATION OF CHEMICAL TREATMENT SECTION

[75] Inventors: Masami Ohtani; Minobu Matsunaga; Tutomu Ueyama; Ryuji Kitakado; Kaoru Aoki, all of Kyoto, Japan

[73] Assignee: Dainippon Screen Mfg. Co., Ltd., Japan

[21] Appl. No.: 08/993,284

[22] Filed: Dec. 18, 1997

[30] Foreign Application Priority Data

Dec. 26, 1996 [JP] Japan .................................. 8-348773
Jan. 28, 1997 [JP] Japan .................................. 9-013926

[51] Int. Cl.$^7$ .................................................. B05C 13/00
[52] U.S. Cl. .......................... 118/52; 118/66; 118/319; 118/320; 414/935; 414/936; 414/941
[58] Field of Search ........................ 118/52, 66, 319, 118/320; 414/935, 936, 941; 134/902

[56] References Cited

U.S. PATENT DOCUMENTS

| | | | |
|---|---|---|---|
| 5,518,542 | 5/1996 | Matsukawa et al. | 118/52 |
| 5,639,301 | 6/1997 | Sasada et al. | 118/52 |
| 5,792,259 | 8/1998 | Yoshioka et al. | 118/52 |
| 5,928,390 | 7/1999 | Yaegashi et al. | 118/50 X |
| 5,972,110 | 10/1999 | Akimoto | 118/52 |

FOREIGN PATENT DOCUMENTS

| | | | |
|---|---|---|---|
| 1-283389 | 11/1989 | Japan . | |
| 404073949 | 3/1992 | Japan | 414/935 |
| 2217107A | 10/1989 | United Kingdom | 414/935 |

*Primary Examiner*—Jeff H. Aftergut
*Attorney, Agent, or Firm*—Ostrolenk, Faber, Gerb & Soffen, LLP

[57] ABSTRACT

An atmospheric conditioning unit for supplying temperature- and humidity-controlled air to a chemical processing part (spin coater) is arranged immediately above a chemical processing part, between this chemical processing part and a heat treatment part (including a hot plate and a cool plate). Namely, the chemical processing part, the atmospheric conditioning unit and the heat treatment part are vertically arranged in a stacked manner. The atmospheric conditioning unit receives external air from an opening. A closed partition is provided to block air flow between the atmospheric conditioning unit and a transport area. The temperature- and humidity-controlled air supplied from the atmospheric conditioning unit to the spin coater forms a downflow in the spin coater, and thereafter rises through an opening and joins with the air flowing from the opening, to be introduced into the atmospheric conditioning unit again and reused.

12 Claims, 12 Drawing Sheets

APPARATUS FOR PROCESSING A SUBSTRATE PROVIDING AN EFFICIENT ARRANGEMENT AND ATMOSPHERIC ISOLATION OF CHEMICAL TREATMENT SECTION

BACKGROUND OF THE INVENTION

1. Field of the Invention

The present invention relates to a substrate processing apparatus for performing a series of processings including a heat treatment and a chemical processing on a thin substrate (hereinafter simply referred to as "substrate") such as a semiconductor wafer or a liquid crystal glass substrate.

2. Description of the Background Art

A substrate processing apparatus is employed for performing various processings on a substrate such as a semiconductor wafer or a glass substrate for a liquid crystal display unit, a photomask or an optical disk. In a fabrication process for a semiconductor device, for example, employed is a substrate processing apparatus prepared by unifying a series of processings and integrating a plurality of processing units with each other for improving production efficiency.

FIG. 12 is a perspective view showing an exemplary conventional substrate processing apparatus. The substrate processing apparatus shown in FIG. 12 has processing areas A and B and a transport area C.

The processing area A is provided with rotary coating units (spin coaters) SC for coating substrates W with a processing solution and a rotary developing unit (spin developer) SD for supplying a developing solution to the substrates W for developing the same in parallel with each other. The processing area B is provided with a plurality of stages of heating units (hot plates) HP for heat-treating (thermal processing) the substrates W and cooling units (cool plates) CP for cooling the substrates W. The transport area C is provided with a transport unit 5 for transporting the substrates W.

A take-in/take-out unit (indexer) 6 for storing the substrates W and taking in/out the same is provided along single ends of the processing areas A and B and the transport area C. The indexer 6 comprises a plurality of cassettes 61 for storing the substrates W and a transfer robot 62 for taking in/out the substrates W. The transfer robot 62 of the indexer 6 moves along arrow U for taking out the substrates W from the cassettes 61, transferring the same to the transport unit 5, receiving the substrates W subjected to the series of processings from the transport unit 5 and returning the same to the cassettes 61.

The transport unit 5 transports the substrate W along arrow S in the transport area C, introduces and discharges the substrates W into and from the aforementioned processing units, and transfers and receives the substrates W to and from the transfer robot 62.

In the aforementioned conventional substrate processing apparatus, a plurality of processing units having different types of functions are planarly arranged while processing units having the same type of functions are vertically arranged in a plurality of st ages.

In recent years, the diameters of substrates are increased for improving producibility, and the dimensions of respective processing units are also increased in response thereto. Thus, a substrate processing apparatus formed by integrating a plurality of processing units with each other is also increased in size, to result in increase of its footprint (area planarly occupied by the substrate processing apparatus). Therefore, there is a need for a substrate processing apparatus which can effectively utilize a space in clean room.

On the other hand, it is important to control atmospheres for substrate processings. Therefore, the aforementioned substrate processing apparatus is generally installed in the clean environment of a clean room or the like. In particular, a chemical processing unit such as the aforementioned spin coater SC or spin developer SD, for example, must be strictly atmosphere-controlled, since not only the cleanliness of the atmosphere but the temperature and humidity thereof exert remarkable influence on the results of the processing.

In general, therefore, a chemical processing unit is supplied with air which is adjusted and controlled in temperature and humidity by a temperature and humidity control unit provided in the exterior of the apparatus. Such a temperature and humidity control unit is installed in a space separated from the apparatus body or set to cover the overall upper surface of the apparatus.

However, the aforementioned temperature and humidity control unit requires an installation space therefor, and hence the footprint of the overall substrate processing system is increased to hinder efficient utilization of the clean room.

Further, the temperature and humidity control unit is set in the exterior of the apparatus, and hence the air adjusted in temperature and humidity must be guided to the apparatus through a duct. This duct also requires a space therefor, and hence the footprint of the overall substrate processing system is further increased. In addition, thermal energy loss is caused by heat radiation from the duct or heat absorption from the exterior of the duct, to cause difficulty in temperature control of the air in the chemical processing part.

SUMMARY OF THE INVENTION

The present invention is directed to an apparatus for processing a substrate. According to the present invention, the apparatus comprises: a) a process stack, comprising: a-1) a first section comprising a chemical processing part for applying a chemical processing to the substrate: a-2) a second section provided on the first section and comprising an atmospheric conditioner for conditioning an atmosphere in the chemical processing part; and a-3) a third section provided on the second section and comprising a thermal processing part for applying a thermal processing to the substrate; and b) transport means for transporting the substrate within the apparatus.

In the apparatus of the present invention, since a plurality of processing parts are arranged in a stacked manner, the installation area can be reduced.

In another aspect of the present invention, the apparatus further comprises: c) wall means surrounding the transport area at a level higher than the transport means.

In still another aspect of the present invention, the atmospheric conditioner is operable to supply air whose temperature and humidity are controlled to the chemical processing part.

It is possible to stably supply air whose temperature and humidity are controlled to the chemical processing part.

An object of the present invention is to provide an apparatus for processing a substrate, which allows reduction in installation area.

Another object of the present invention is to provide an apparatus for processing a substrate, which is capable of stably supplying air whose temperature and humidity are controlled to the chemical processing part without an increase in its footprint.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

<First Embodiment>

Figure 1:
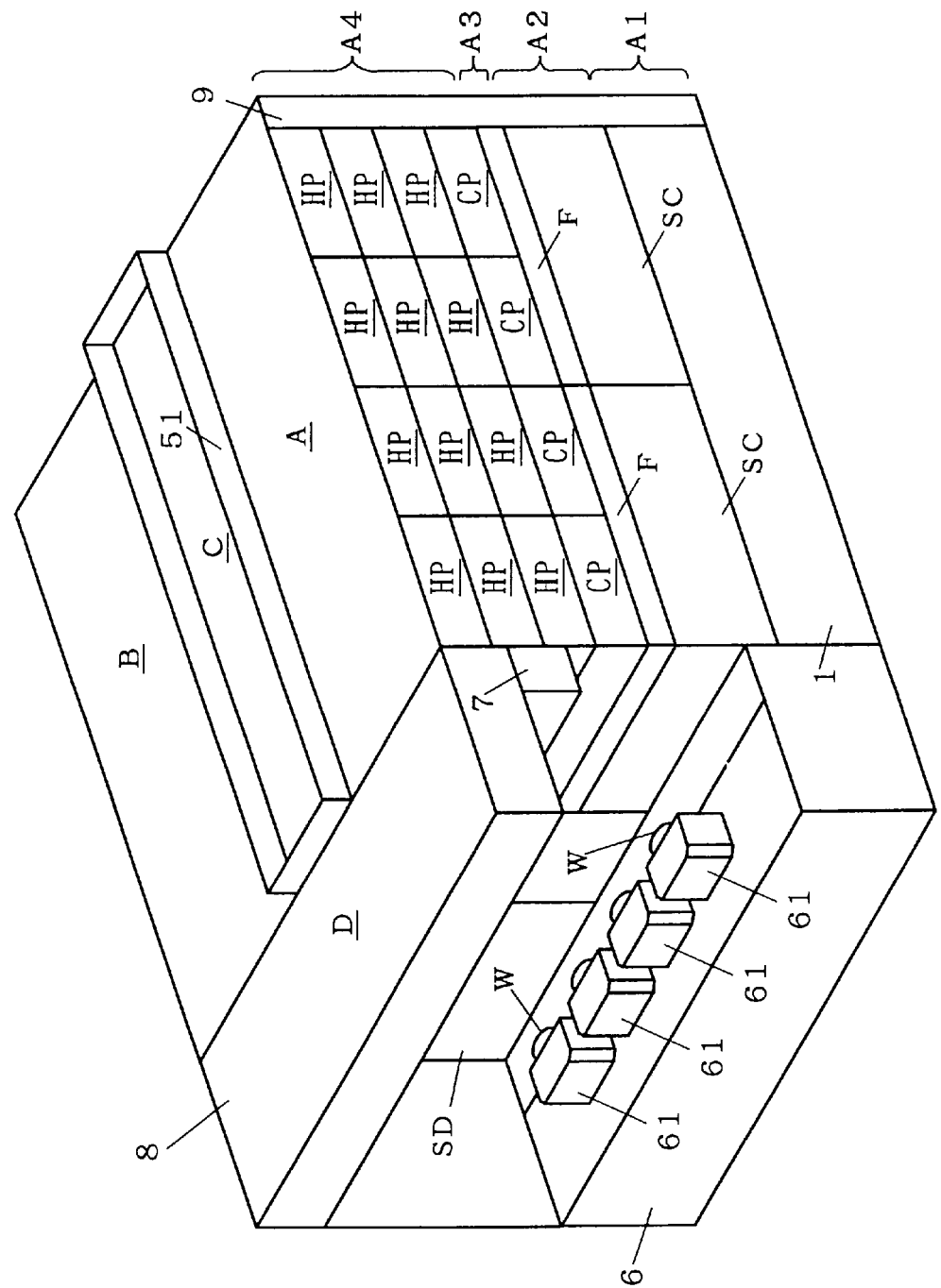
FIG. 1 is a perspective view showing a substrate processing apparatus according to a first embodiment of the present invention.
Figure 2:
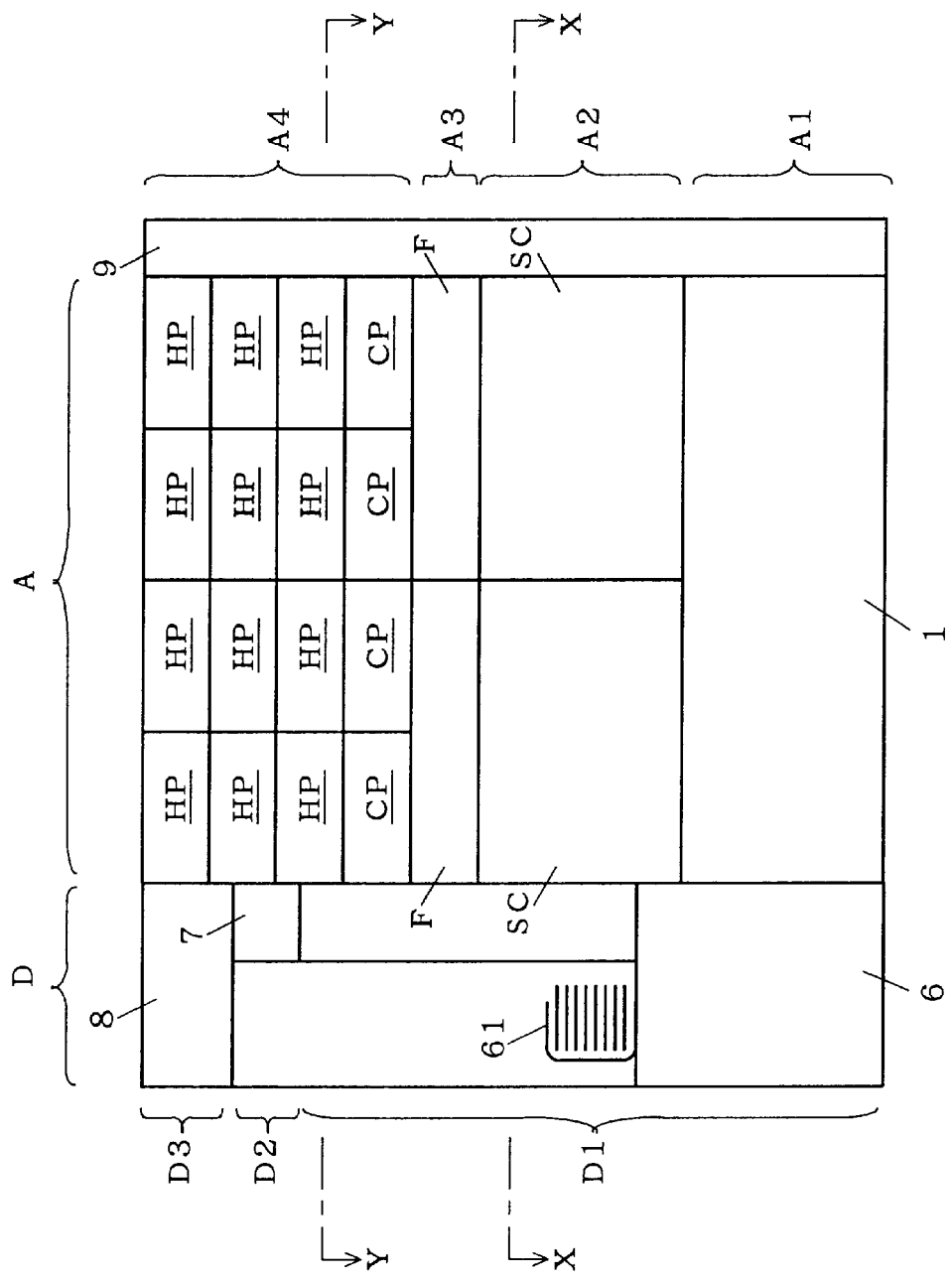
FIG. 2 is a front elevational view of the substrate processing apparatus shown in FIG. 1.
Figure 3:
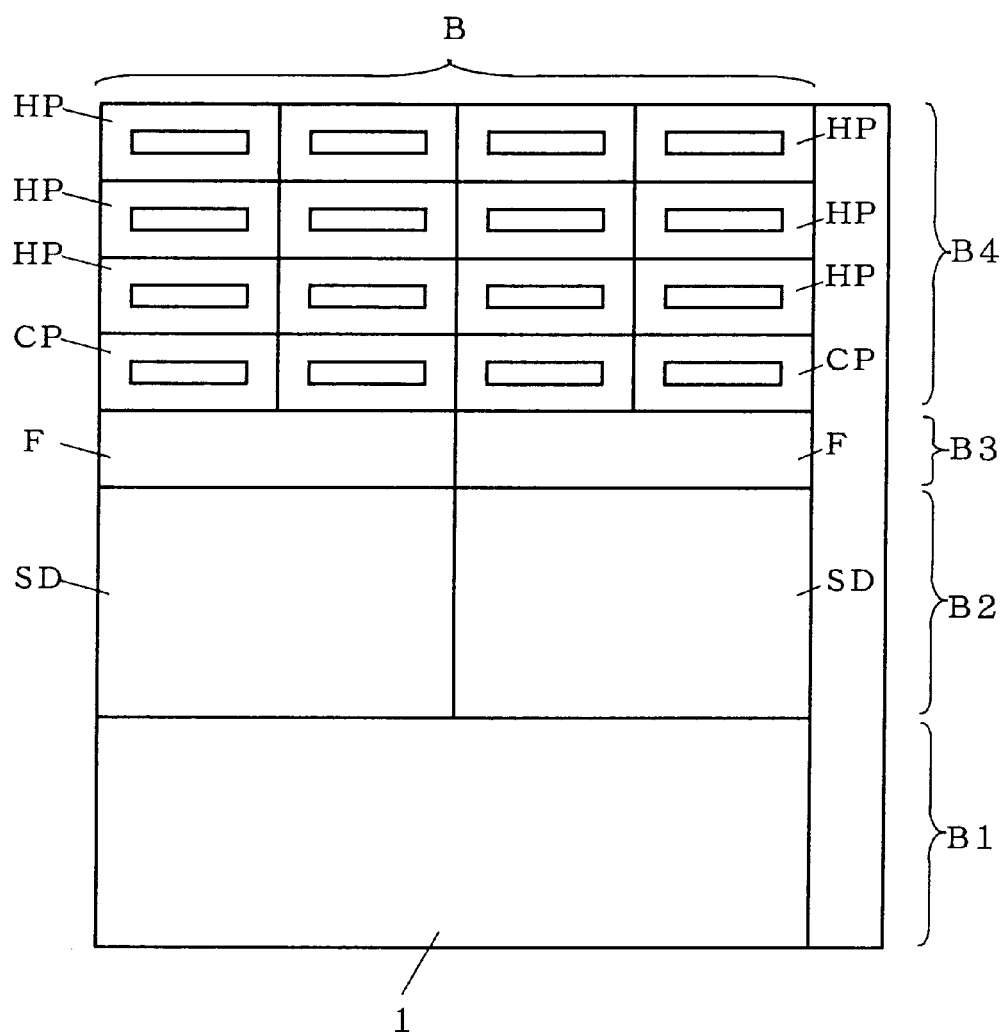
FIG. 3 is a front elevational view of a principal part of the substrate processing apparatus shown in FIG. 1 as viewed from a transport area.
Figure 4:
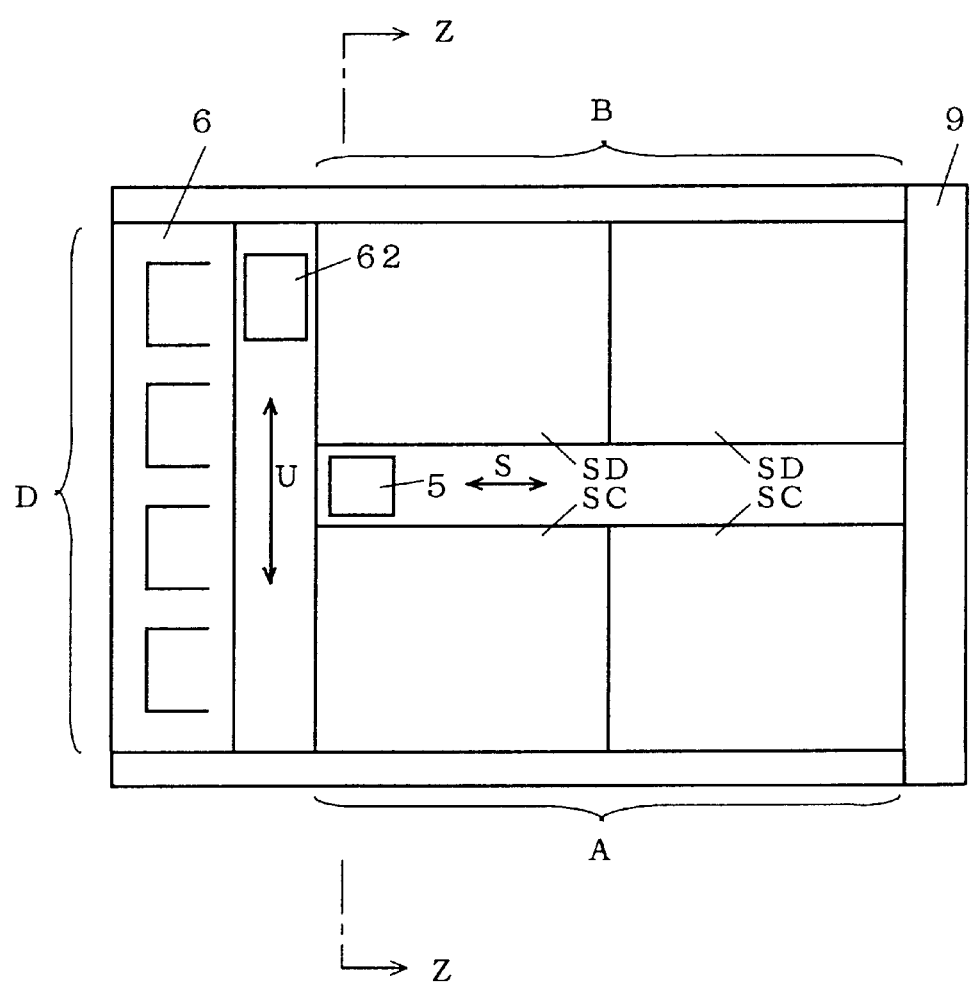
FIG. 4 is a plan view of the substrate processing apparatus as viewed along the line X—X in FIG. 2.
Figure 5:
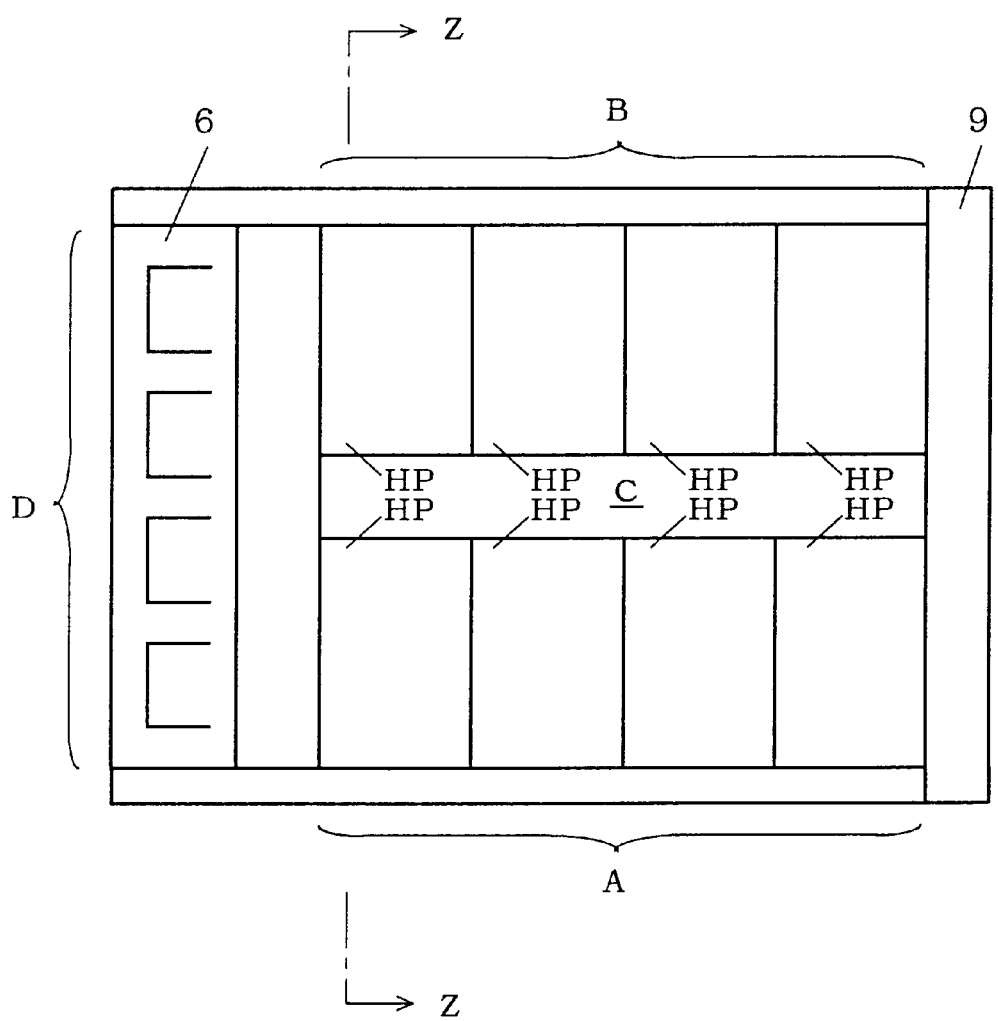
FIG. 5 is a plan view of the substrate processing apparatus as viewed along the line Y—Y in FIG. 2.
Figure 6:
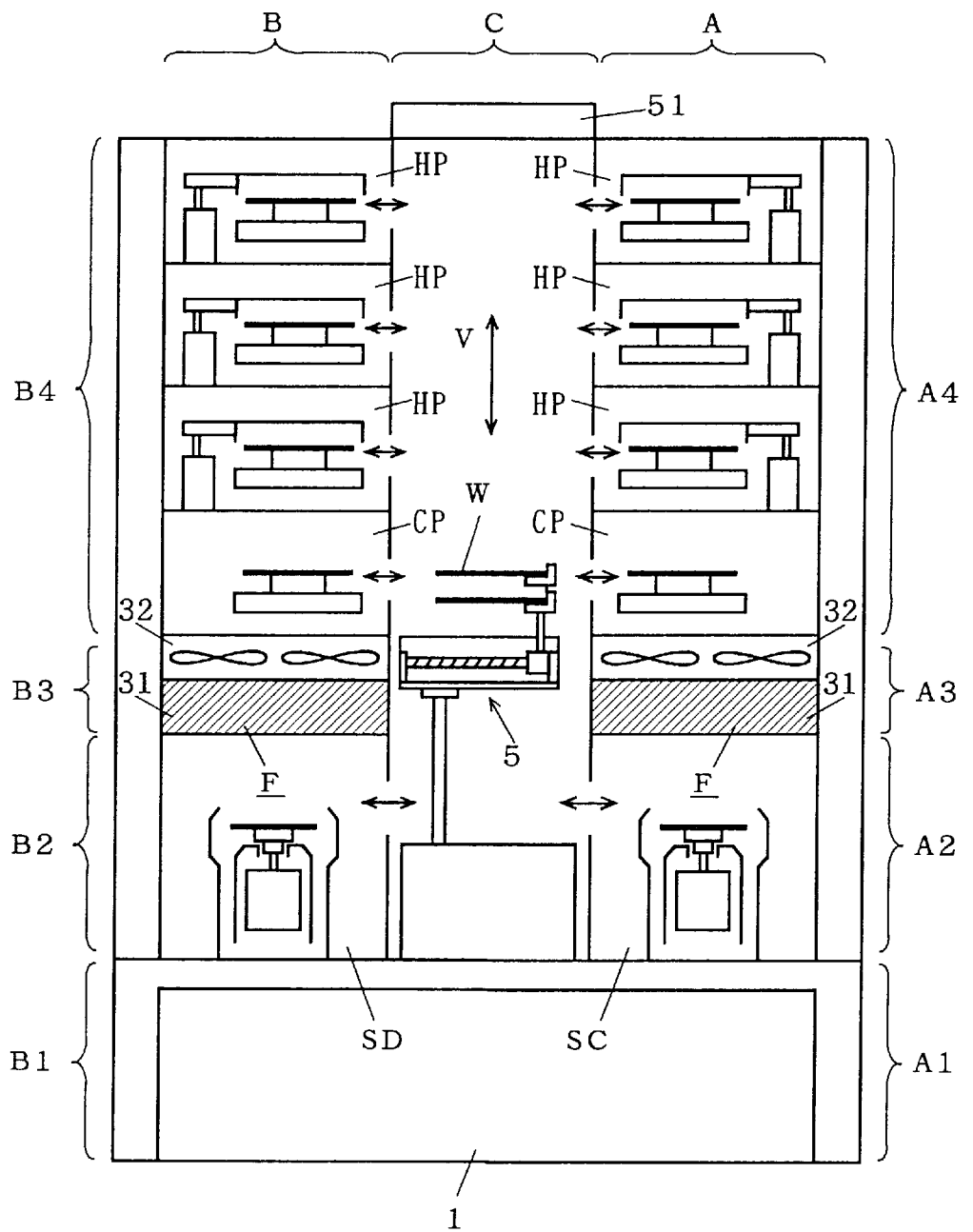
FIG. 6 is a side elevational view of the substrate processing apparatus as viewed along the lines Z—Z in FIGS. 4 and 5.

FIG. 1 is a perspective view showing a substrate processing apparatus according to a first embodiment of the present invention, FIG. 2 is a front elevational view of the substrate processing apparatus shown in FIG. 1, and FIG. 3 is a front elevational view of a principal part of the substrate processing apparatus shown in FIG. 1 as viewed from a transport area. FIG. 4 is a plan view of the substrate processing apparatus as viewed along the line X—X in FIG. 2, and FIG. 5 is a plan view as viewed along the line Y—Y in FIG. 2. FIG. 6 is a side elevational view of the substrate processing apparatus as viewed along the lines Z—Z in FIGS. 4 and 5.

Referring to FIG. 1, the substrate processing apparatus is provided with processing areas A and B, a transport area C and a take-in/take-out area D. The processing areas A and B are arranged on both sides of the transport area C, while the take-in/take-out area D is arranged along single sides of the processing areas A and B and the transport area C.

The processing area A includes first, second, third and fourth layers A1, A2, A3 and A4 which are arranged successively from the bottom to the top. Similarly, the processing area B includes first, second, third and fourth layers B1, B2, B3 and B4 which are arranged successively from the bottom to the top.

The first layer A1 of the processing area A is provided with a chemical unit 1. The chemical unit 1 stores a processing solution (chemical solution), a waste solution, a pump and an exhaust system. The second layer A2 is provided with a plurality of rotation processing units. According to this embodiment, the second layer A2 is provided with a plurality of rotary coating units (spin coaters) SC for coating substrates W with a resist.

The third layer A3 is provided with a plurality of atmospheric conditioning units F each consisting of a filter 31 such as an ULPA (ultra-low penetration air) filter or a chemical absorption filter and a fan 32 (see FIG. 6). The fourth layer A4 is provided with a plurality of heat treatment (thermal processing) units. According to this embodiment, a plurality of cooling units (cool plates) CP and a plurality of heating units (hot plates) HP for cooling and heating the substrates W respectively are arranged in a plurality of stages.

The chemical unit 1 supplies the resist to the spin coaters SC provided thereon, and discharges the waste solution and air from the same. The atmospheric conditioning units F supply clean air which is controlled in temperature and humidity to the spin coaters SC provided under the same for adjusting the atmospheres thereof.

The first layer B1 of the processing area B is provided with a chemical unit 1. The second layer B2 is provided with a plurality of rotation processing units. According to this embodiment, the second layer B2 is provided with a plurality of rotary developing units (spin developers) SD for developing the substrates W. The third layer B3 is provided with a plurality of atmospheric conditioning units F. The fourth layer B4 is provided with a plurality of heat treatment units. According to this embodiment, the fourth layer B4 is provided with a plurality of cool plates CP and a plurality of hot plates HP in a plurality of stages.

The chemical unit 1 supplies a developing solution to the spin developers SD provided thereon, and discharges a waste solution and air from the same. The atmospheric conditioning units F supply clean air which is controlled in temperature and humidity to the spin developers SD provided under the same for adjusting the atmospheres thereof.

A substrate transport robot 5 for transporting the substrates W is arranged on the transport area C, to be movable along the processing areas A and B in a direction of arrow S (see FIG. 4) and vertically movable along arrow V (see FIG. 6).

The take-in/take-out area D includes first, second and third layers D1, D2 and D3 which are arranged successively from the bottom to the top. The first layer D1 of the take-in/take-out area D is provided with a take-in/take-out unit (indexer) 6 for storing, introducing and discharging the substrates W. The indexer 6 comprises a plurality of cassettes 61 for storing the substrates W and a transfer robot 62 for introducing and discharging the substrates W. The second layer D2 is provided with an atmospheric conditioning unit 7 consisting of a filter and a fan. The third layer D3 is provided with an electric control unit 8.

The transfer robot 62 of the indexer 6 takes out the substrates W from the cassettes 61 and transfers the same to the substrate transport robot 5, and receives the substrates W subjected to a series of processings from the substrate transport robot 5 and returns the same to the cassettes 61. The substrate transport robot 5 transports the substrates W along arrows S and V in the transport area C, introduces and discharges the substrates W in and from the respective processing units in the processing areas A and B, and transfers and receives the substrates W to and from the transfer robot 62.

A separator 51 for separating the transport area C from the adjacent processing areas A and B and the take-in/take-out area D is provided on an upper portion of the transport area C, to enclose the transport area C. Therefore, only a downflow from above the transport area C can flow into the transport area C, so that no downflows striking upper surfaces of the processing units of the processing areas A and B and the take-in/take-out area D flow into the transport area C. Thus, the transport area C is prevented from concentration of such downflows. A utility housing part 9 is provided along other end portions of the processing areas A and B and the transport area C.

According to this first embodiment, the spin coaters SC, the spin developers SD, the cool plates CP and the hot plates HP correspond to processing parts. The substrate transport robot 5 corresponds to transport means.

A plurality of processing units are hierarchically arranged in response to the functions thereof in the substrate processing apparatus according to this 10 embodiment, whereby the footprint (area planarly occupied by the substrate processing apparatus) is reduced. Further, the processing units having different types of functions are vertically arranged, whereby the time for transporting the substrates between the different types of processing units is reduced. Thus, the throughput is improved.

In particular, the atmospheric conditioning units F are arranged immediately above the spin coaters SC and the spin developers SD respectively, whereby the atmospheres for rotary coating and rotary development can be efficiently maintained in excellent states. Further, the chemical units 1 are arranged immediately under the spin coaters SC and the spin developers SD respectively, whereby supply of the processing solutions, discharge of the waste solutions and exhaustion can be efficiently performed in a simple piping structure.

In addition, the spin coaters SC and the spin developers SD are arranged on the intermediate layer, whereby the states of the rotary coating and the rotary development can be readily visually confirmed.

Further, the cool plates CP and the hot plates HP are arranged above the spin coaters SC and the spin developers SD through the atmospheric conditioning units F respectively, whereby the lower spin coaters and developers SC and SD and the upper cool and hot plates CP and HP hardly influence to each other by heat and atmospheres thereof.

In addition, the spin coaters SC and the spin developers SD are horizontally arranged on the same lower layer, thereby hardly influencing the remaining processing units when causing leakage or the like.

Further, no downflows concentrate on the transport area C due to the separator 51, whereby the substrates W can he transported in an excellent atmosphere.

The atmospheric conditioning units 7 are arranged above the indexer 6 in the take-in/take-out area D, whereby the substrates W can be introduced and discharged in an excellent atmosphere. Further, the electric control unit 8 is arranged on the uppermost portion of the take-in/take-out area D, whereby the installation area is reduced.

While the spin coaters SC and the spin developers SD are arranged on the second layers A2 and B2 as rotation processing units in the aforementioned embodiment, other rotation processing units such as rotary cleaning units or edge exposure units may be arranged in place of or in addition to the spin coaters SC and the spin developers SD.

While the cool plates CP and the hot plates HP are arranged on the fourth layers A4 and B4 as heat treatment units in the aforementioned embodiment, other heat treatment units such as adhesion reinforcing units for adhesion reinforcement may be arranged in place of or in addition to the cool plates CP or the hot plates HP.

While the indexer 6 is arranged on the first layer D1 of the take-in/take-out area D in the aforementioned embodiment, an interface unit for transferring and receiving the substrates W to and from another substrate processing apparatus such as an exposure unit may be arranged in place of or in addition to the indexer 6. The indexer 6 or the interface unit may be arranged on an end portion opposite to the take-in/take-out area D.

<Second Embodiment>

Figure 7:
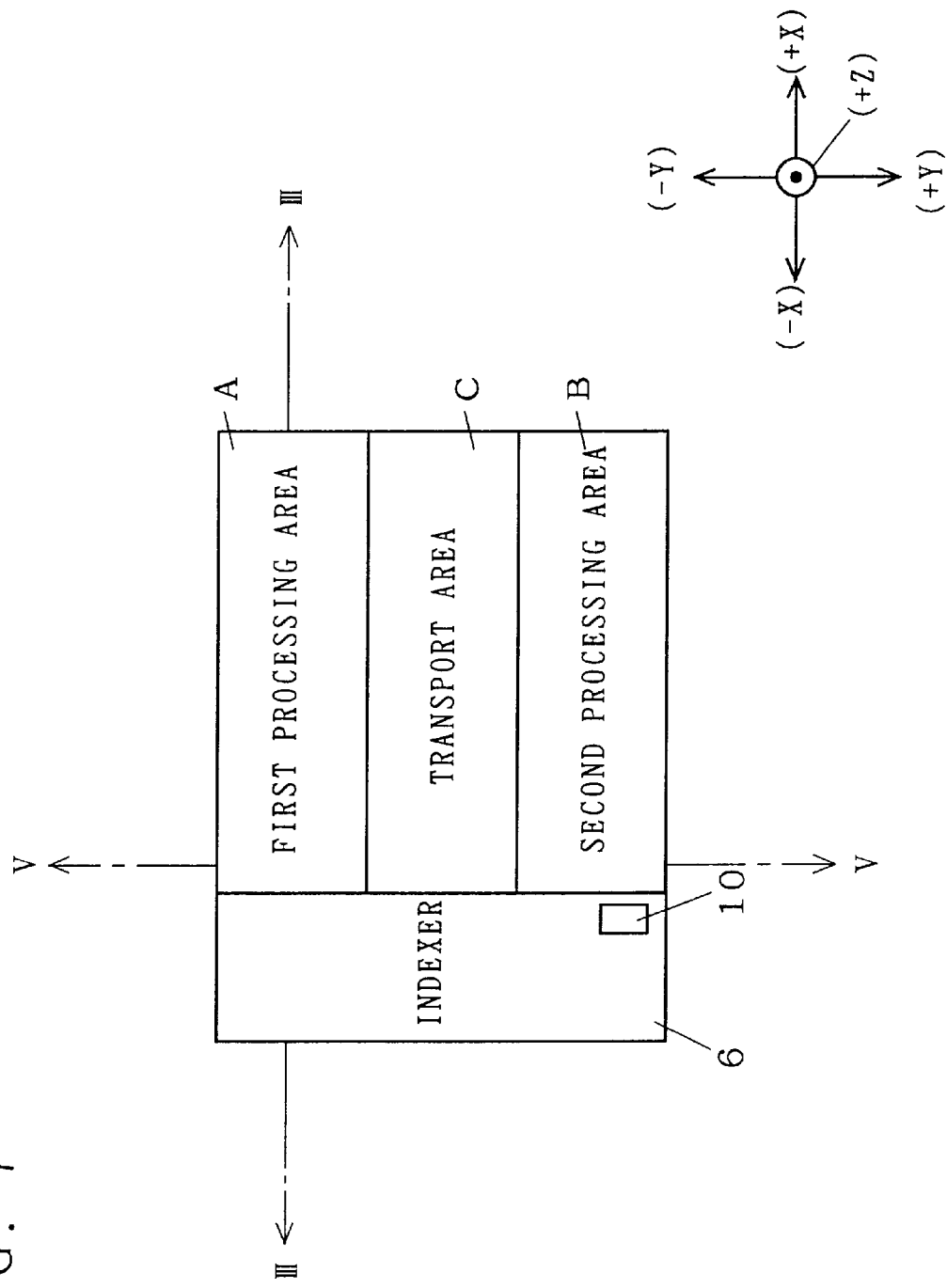
FIG. 7 is a schematic plan view of a substrate processing apparatus according to a second embodiment of the present invention.
Figure 8:
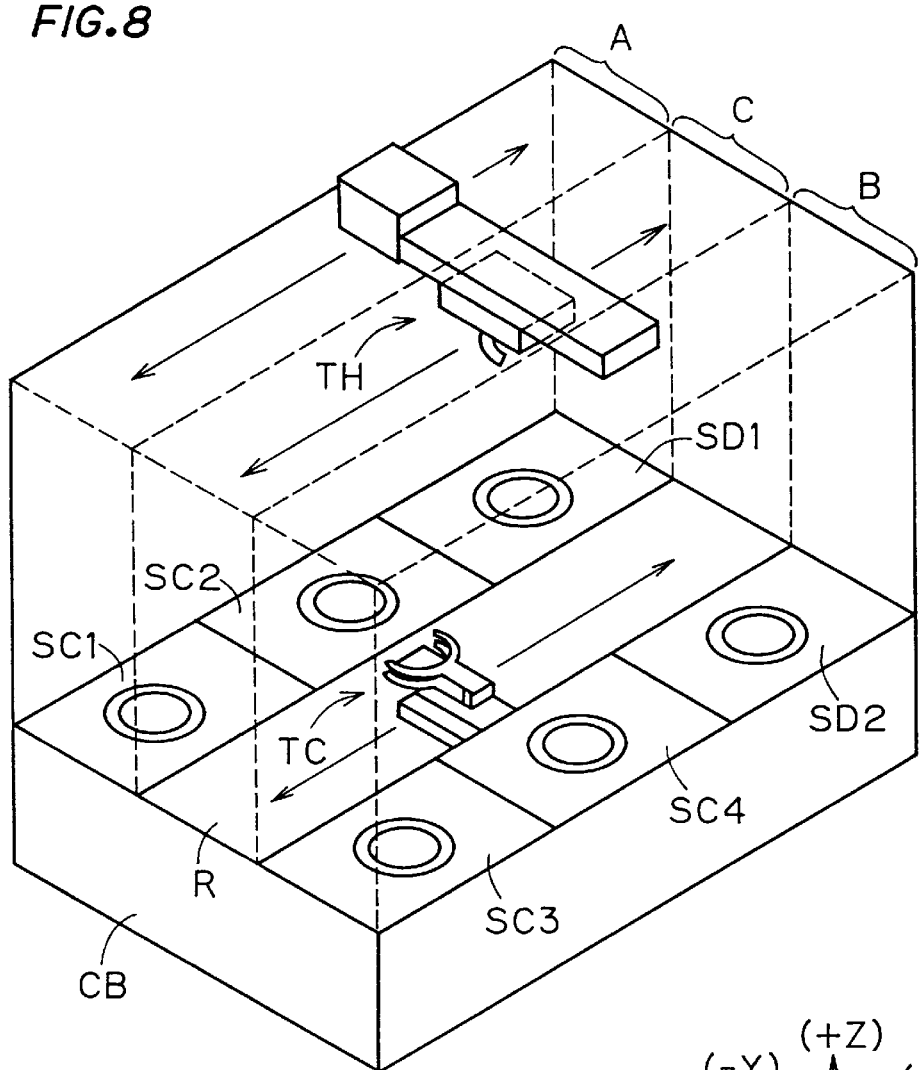
FIG. 8 is a typical perspective view of the substrate processing apparatus shown in FIG. 7.

FIG. 7 is a schematic plan view showing a substrate processing apparatus according to a second embodiment of the present invention. FIG. 8 is a typical perspective view of the substrate processing apparatus shown in FIG. 7. FIGS. 7 to 10 are provided with X-Y-Z rectangular coordinate systems, in order to clarify directional relations. It is assumed that a horizontal plane parallel to the floor face is an X-Y plane, and the vertical direction is a Z direction. When not distinguished from each other, each of (+X) and (−X) directions is simply referred to as an X direction (this also applies to Y and Z directions). As shown in FIG. 7, the substrate processing apparatus according to the second embodiment of the present invention comprises an indexer 6 for introducing/discharging substrates, a transport area C for transporting the substrates, a first processing area A, and a second processing area B.

The indexer 6 is provided with cassettes (not shown) storing the substrates, and comprises a substrate transfer robot for taking out or storing the substrates from or in the cassettes. The indexer 6 is adapted to supply untreated substrates to the first and second processing areas A and B, and to receive treated substrates. The indexer 6 is provided with a control part 10, which manages and controls various operations of the substrate processing apparatus such as those of substrate transport robots described later, various heat treatments, a chemical processing and an operation of an atmospheric conditioning unit. FIG. 8 omits the indexer 6, for convenience of illustration.

The transport area C is provided with two substrate transport robots TH and TC, as shown in FIG. 8. These substrate transport robots TH and TC circularly transport the substrates between the indexer 6 and respective processing parts included in the first and second processing areas A and B. The substrate transport robot TC is uprighted on a lower portion of the transport area C, while the substrate transport robot TH is suspended from an upper portion of the transport area C at a height different from that of the substrate transport robot TC. The two substrate transport robots TH and TC are freely movable along the X direction, and drivable and rotatable along the vertical direction (Z direction).

Figure 9:
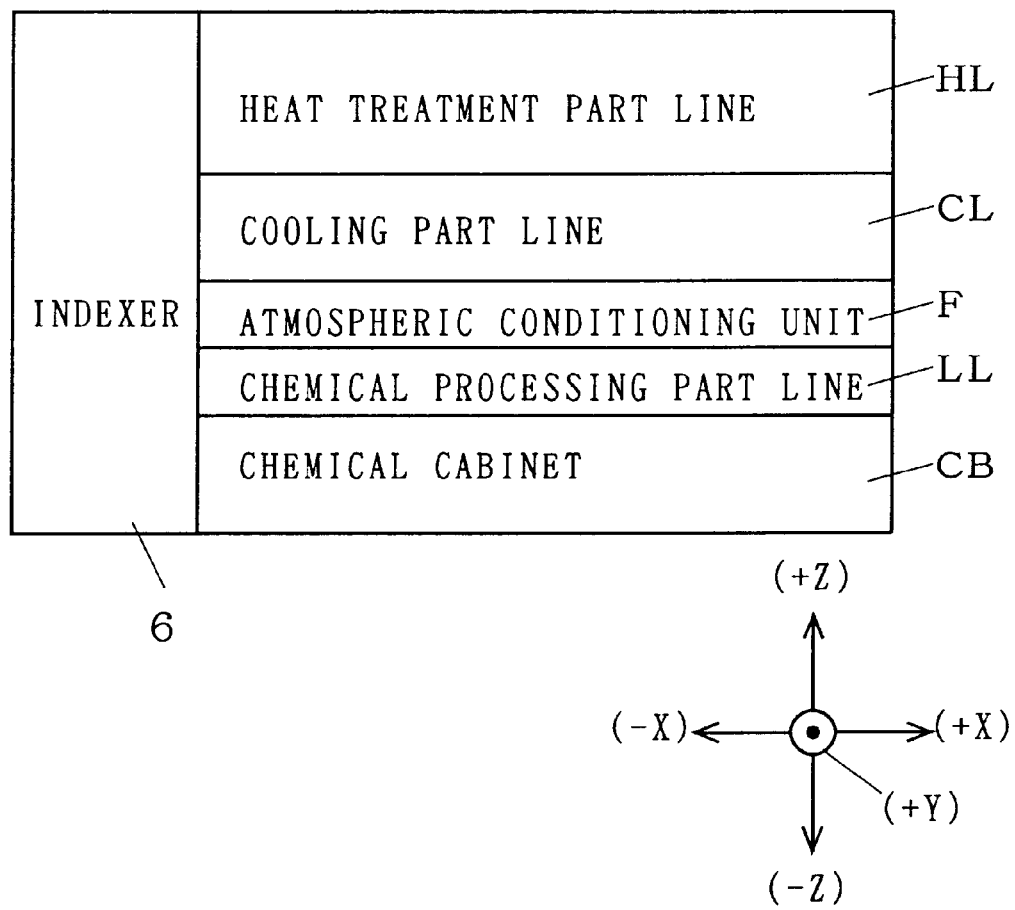
FIG. 9 is a schematic side elevational view of the substrate processing apparatus as viewed along the line III—III in FIG. 7 in a (-Y) direction.

The first and second processing areas A and B are opposed to each other through the transport area C. FIG. 9 is a schematic side elevational view of the substrate processing apparatus as viewed along the line III—III in FIG. 7 in the (−Y) direction, and illustrates the structure of a side surface of the first processing area A. As shown in FIG. 9, the first processing area A has a multistage structure provided with a heat treatment part line HL, a cooling part line CL, an atmospheric conditioning unit F and a chemical processing part line LL which are arranged successively from the top to the bottom to be stacked along the vertical direction. The second processing area B has a similar structure to the first processing area A. A chemical cabinet CB is a base part for the first and second processing areas A and B and the transport area C. This chemical cabinet CB is a space which has functions equivalent to those of the chemical units 1 according to the first embodiment, and is provided with chemical solution tanks for storing chemical solutions such as a resist and a developing solution and waste solution collecting units for collecting waste solutions after processings.

In the heat treatment part line HL, a plurality of hot plates (heating parts) are two-dimensionally arranged in the horizontal direction (X direction) and the vertical direction (Z direction). Similarly, a plurality of cool plates (cooling parts) are two-dimensionally arranged on the cooling part line CL in the horizontal direction (X direction) and the vertical direction (Z direction). Similarly to the first embodiment, the hot plates are ovens for heat-treating t he substrates, and the cool plates are adapted to cool the heated substrates. Thus, the hot and cool plates can be regarded as processing parts for transferring and absorbing heat to and from the substrates, and are hereinafter generically referred to as a heat treatment (thermal processing) part in this specification.

In the chemical processing part line LL, spin coaters (rotary resist coating units) SC1 and SC2 and a spin developer (rotary developing unit) SD1 are one-dimensionally arranged in the horizontal direction (X direction) (see FIG. 8). The spin coaters SC1 and SC2 and the spin developer SD1 are also processing parts for performing prescribed processings with the resist and the developing solution respectively similarly to those in the first embodiment, and hereinafter generically referred to as a chemical processing part in this specification.

The atmospheric conditioning unit F is arranged immediately above the chemical processing part line LL, between this chemical processing part line LL and the cooling part line CL. In other words, the atmospheric conditioning unit F is held between the heat treatment part and the chemical processing part. This atmospheric conditioning unit F is adapted to supply air (temperature- and humidity-controlled air) which is controlled in temperature and humidity with removal of particles floating in the air. The structure of this atmospheric conditioning unit F is further described later.

In the substrate processing apparatus according to the second embodiment, the atmospheric conditioning unit F is arranged between the heat treatment part and the chemical processing part, whereby no specific space for the atmospheric conditioning unit F is required and the overall substrate processing apparatus can be prevented from increase of its footprint.

Further, the atmospheric conditioning unit F is positioned immediately above the chemical processing part and no duct is required between these parts, whereby thermal energy loss can be reduced and air which is controlled in temperature and humidity can be stably supplied to the chemical processing part.

In addition, the atmospheric conditioning unit F is arranged between the heat treatment part and the chemical processing part, whereby thermal influence from the heat treatment part is intercepted by the atmospheric conditioning unit F, not to be exerted on the chemical processing part. Therefore, thermally stable treatments can be performed in the chemical processing part.

Figure 10:
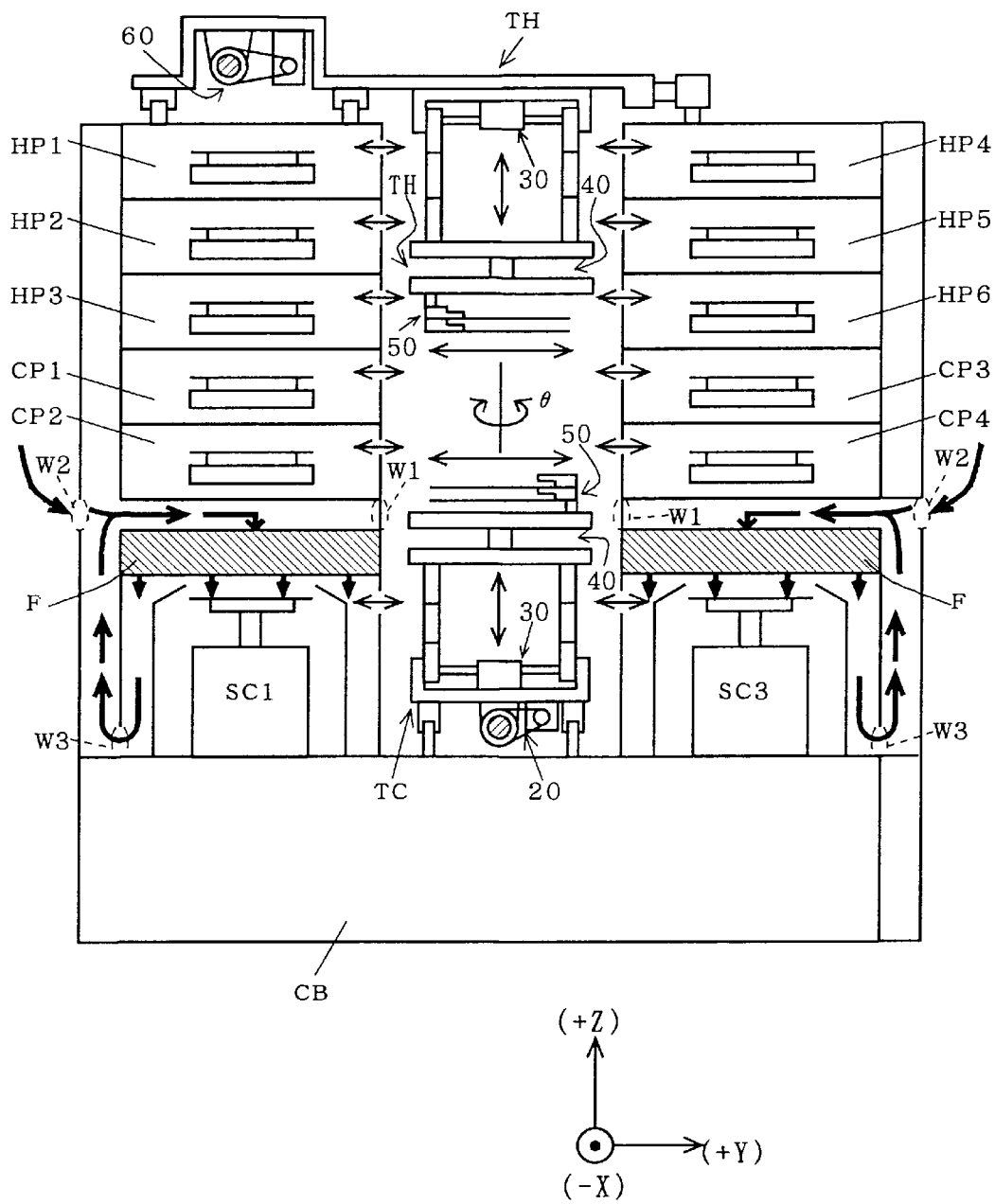
FIG. 10 is a schematic side elevational view of the substrate processing apparatus as viewed along the line V—V in FIG. 7 in a (+X) direction.

FIG. 10 illustrates the structure of a side surface of the substrate processing apparatus as viewed along the line V–V in FIG. 7 in the (+X) direction. Referring to FIG. 10, thick arrows show flows of air around the atmospheric conditioning unit F. As shown in FIG. 10, hot plates HP1, HP2 and HP3, cool plates CP1 and CP2, the atmospheric conditioning unit F and the spin coater SC1 are arranged successively from the top to the bottom on the first processing area A.

Similarly, hot plates HP4, HP5 and HP6, cool plates CP3 and CP4, the atmospheric conditioning unit F and a spin coater SC3 are arranged successively from the top to the bottom on the second processing area B. The two substrate transport robots TH and TC are provided between the processing areas A and B.

The substrate transport robot TC comprises an X-direction driving mechanism 20, a Z-direction (vertical) driving mechanism 30, a rotation mechanism 40 and an arm sliding mechanism 50. The substrate transport robot TH comprises driving mechanisms similar to those of the substrate transport robot TC, except an X-direction driving mechanism 60. The X-direction driving mechanisms 20 and 60, which are set on different positions, are adapted to move the robots TC and TH on rails along the X direction by normally and reversely rotating nut members which are fitted with screw shafts by motors. The Z-direction driving mechanisms 30 utilize stretch driving of a pantagraph structure. The rotation mechanisms 40 and the arm sliding mechanisms 50 are adapted to rotate arms of the substrate transport robots TC and TH in horizontal planes and advancing/retreating the arms respectively.

Due to the aforementioned driving mechanism 20 to 60, the substrate transport robots TC and TH can move on the transport area C, access the chemical processing part and the heat treatment part, and transfer and receive the substrates to and from the processing parts. In the substrate processing apparatus according to this second embodiment, the substrate transport robot TC accesses the chemical processing part and the cooling part while the substrate transport robot TH accesses the heating part and the cooling part, in order to prevent thermal influence on the substrates treated in the chemical processing part.

The structure of the atmospheric conditioning unit F is now described. As hereinabove described, the atmospheric conditioning unit F is provided immediately above the chemical processing part line LL, i.e., immediately above the spin coaters SC1, SC2, SC3 and SC4 and the spin developers SD1 and SD2 (see FIG. 8).

Figure 11:
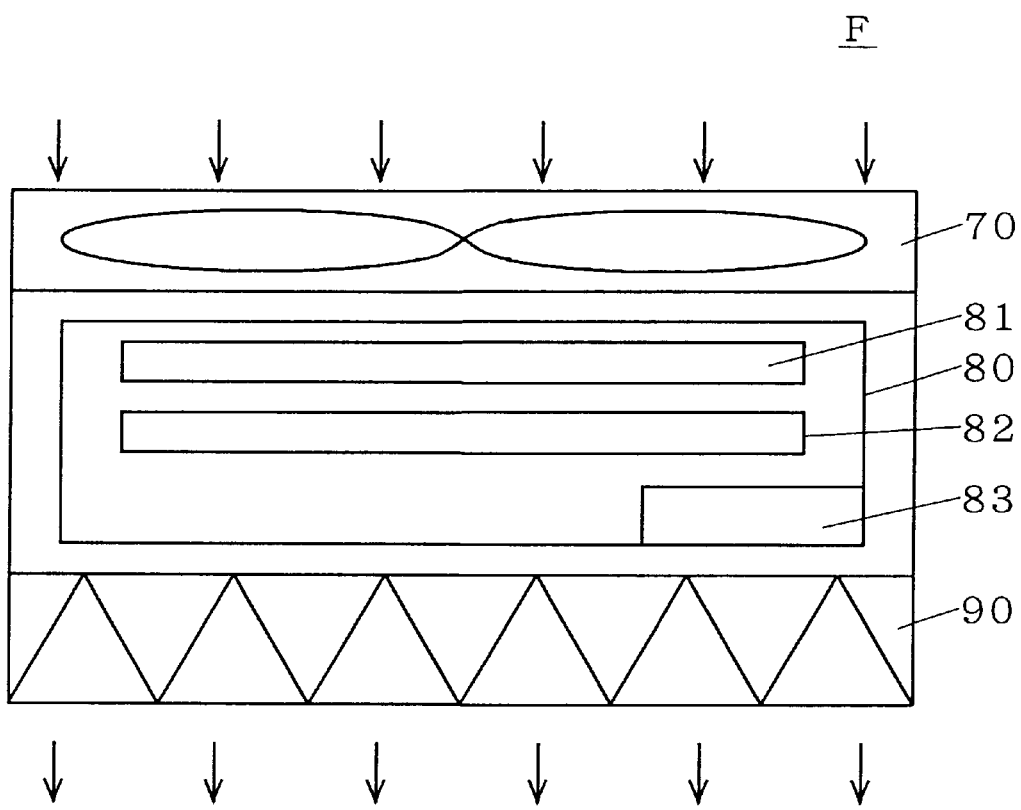
FIG. 11 is a schematic view of the atmospheric conditioning unit F.
Figure 12:
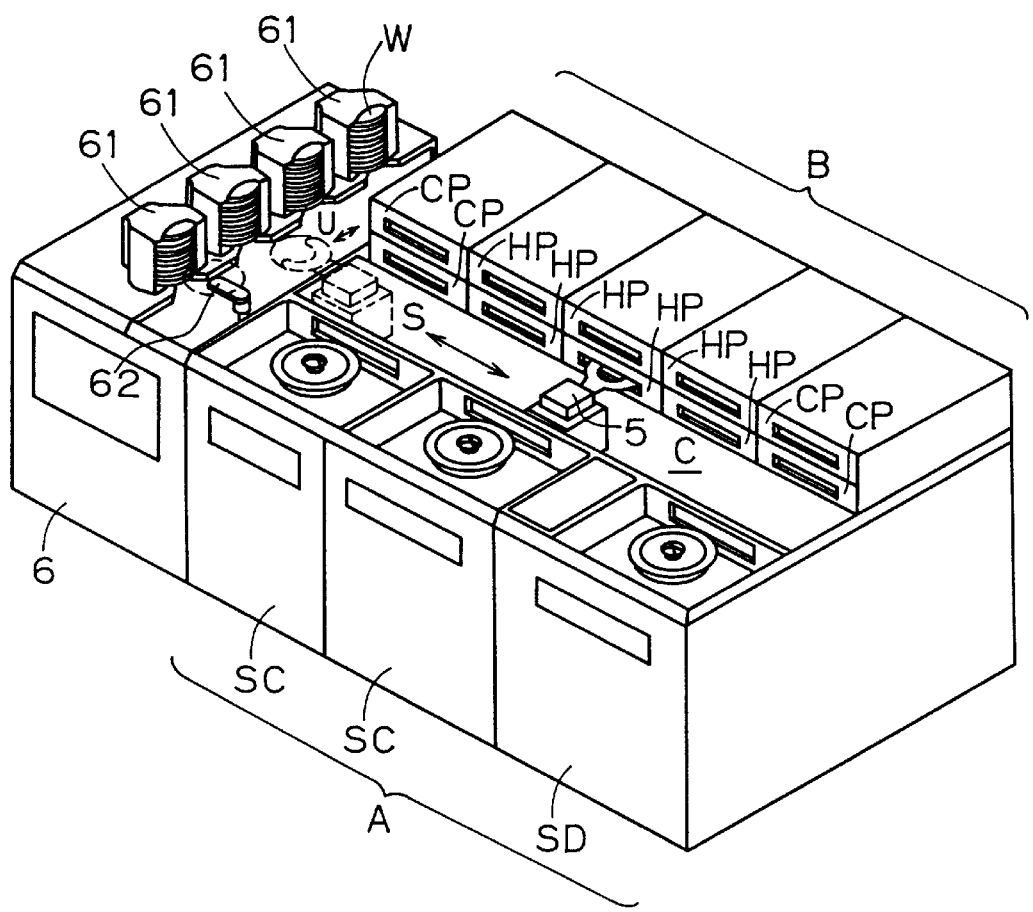
FIG. 12 is a perspective view showing an exemplary conventional substrate processing apparatus.

FIG. 11 is a block diagram of the atmospheric conditioning unit F. The atmospheric conditioning unit F comprises a fan 70, a temperature and humidity control part 80 and a filter 90. The temperature and humidity control part 80 comprises a refrigerator 81, a heater 82 and a humidifier 83. Air introduced into the atmospheric conditioning unit F from above due to rotation of the fan 70 is temperature-controlled by the refrigerator 81 and the heater 82, and humidity-controlled by the humidifier 83. At this time, the temperature and humidity are so controlled that the air supplied to the chemical processing part is at a prescribed temperature and humidity on the basis of a signal detected by a temperature/humidity sensor (not shown) provided on the chemical processing part. The temperature- and humidity-controlled air passes through the filter 90 so that particles are removed therefrom, and is downwardly delivered from the atmospheric conditioning unit F. The filter 90 may be formed by a HEPA (high-efficiency particulate air) filter, or an ULPA (ultra-low penetration air) filter if higher cleanliness is required.

Referring again to FIG. 10, the atmospheric conditioning unit F receives external air from an opening W2 in the substrate processing apparatus. A part W1 in FIG. 10 is closed. Namely, an air flow between the atmospheric conditioning unit F and the transport area C is intercepted, so that the atmospheric conditioning unit F receives no air from the transport area C.

In the transport area C, particles may he caused due to the movement of the substrate transport robots TC, TH or the temperature of the air may be increased due to radiation from a plurality of heating parts. In the substrate processing apparatus according to the second embodiment, the atmospheric conditioning unit F receives no air from the transport area C. Thus, the atmospheric conditioning unit F receives no air containing particles or having an increased temperature, whereby the burden of the atmospheric conditioning unit F can be reduced.

The temperature- and humidity-controlled air supplied from the atmospheric conditioning unit F to the spin coater SC1 (or SC3) forms a downflow (a downward unidirectional flow from above) in the spin coater SC1, thereafter rises through an opening W3 and joins with the air flowing from the opening W2, to be introduced into the atmospheric conditioning unit F again and reused.

Thus, the air already controlled in temperature and humidity is reused, whereby thermal energy loss can he reduced and the burden of the atmospheric conditioning unit F can be reduced.

While the second embodiment has been described, the present invention is not restricted to this. For example, the number of the substrate transport robots is not restricted to two but a single substrate transport robot is also employable, and a driving mechanism therefor can be formed by a well-known driving mechanism such as a belt mechanism employing a pulley and a belt.

The filter 90 may further comprise a chemical absorption filter for absorbing ammonia gas or the like.

While the invention has been shown and described in detail, the foregoing description is in all aspects illustrative and not restrictive. It is therefore understood that numerous modifications and variations can be devised without departing from the scope of the invention.

What is claimed is:

1. An apparatus for processing a substrate, comprising:
    a) a process stack, comprising:
        a-1) a first section comprising a chemical processing part for performing a chemical process on said substrate;
        a-2) a second section stacked on said first section and comprising an atmospheric conditioner for conditioning an atmosphere in said chemical processing part; and
        a-3) a third section stacked on said second section and comprising a thermal processing part for performing a thermal process on said substrate; and
    b) a transport mechanism for transporting said substrate within said apparatus.

2. The apparatus in accordance with claim 1, wherein said atmospheric conditioner comprises
    a filter; and
    a fan for supplying atmosphere to said chemical processing part through said filter.

3. The apparatus in accordance with claim 1, further comprising:
    c) a transport area defined at a side of said process stack, said transport mechanism being provided in said transport area.

4. The apparatus in accordance with claim 1, further comprising:
    c) a wall surrounding said transport area at a level higher than said transport mechanism.

5. The apparatus in accordance with claim 1, wherein said first section comprises
    a plurality of chemical processing parts horizontally arranged.

6. The apparatus in accordance with claim 1, wherein said atmospheric conditioner is operable to supply a flow of temperature- and humidity-controlled air to said chemical processing part.

7. The apparatus in accordance with claim 6, said apparatus further comprising:
    c) a transport area defined at a side of said process stack, said transport mechanism being provided in said transport area; and
    d) blocking means for blocking air flow between said transport area and said atmospheric conditioner.

8. The apparatus in accordance with claim 7, further comprising:
    e) a feedback path for feeding said air from said chemical processing part back to said atmospheric conditioner.

9. The apparatus in accordance with claim 7,
    wherein said thermal processing part comprises
        a heating unit for heating said substrate, and
        a cooling unit for cooling said substrate, and wherein said transport mechanism comprises
            a first transport robot operable to hold said substrate and access said chemical processing part and said cooling unit, and
            a second transport robot operable to hold said substrate and access said heating unit and said cooling unit.

10. The apparatus in accordance with claim 6, wherein said atmospheric conditioner comprises
    a temperature control part comprising a refrigerator and a heater for controlling the temperature of the supplied air, and
    a humidifier for controlling the humidity of the supplied air.

11. An apparatus for processing a substrate, comprising:
    a) a process stack, comprising:
        a-1) a first section comprising a chemical processing part including at least one of a resist coating unit for coating said substrate with a resist and a developing unit for developing said substrate with a developing solution;
        a-2) a second section comprising an atmospheric conditioner including a filter, a temperature and humidity control part and a fan for supplying air whose temperature and humidity are controlled by said temperature and humidity control part through said filter to said chemical processing part, for conditioning an atmosphere in said chemical processing part, said second section being stacked on said first section; and
        a-3) a third section comprising a thermal processing part for applying a thermal processing to said substrate, said third section being stacked on said second section; and
    b) a transport mechanism for transporting said substrate within said apparatus.

12. The apparatus in accordance with claim 11, wherein said temperature and humidity control part comprises a refrigerator and a heater for controlling temperature of introduced air and a humidifier for controlling humidity thereof.

\* \* \* \* \*